United States Patent [19]

Reid et al.

[11] 4,219,771
[45] Aug. 26, 1980

[54] FOUR-QUADRANT, MULTIPROBE-EDGE SENSOR FOR SEMICONDUCTOR WAFER PROBING

[75] Inventors: Lee R. Reid, Plano; Charles R. Ratliff, Richardson, both of Tex.

[73] Assignee: Texas Instruments Incorporated, Dallas, Tex.

[21] Appl. No.: 879,038

[22] Filed: Feb. 21, 1978

[51] Int. Cl.² .................. G01R 31/02; G01R 31/22
[52] U.S. Cl. ........................ 324/158 P; 324/158 F; 324/72.5
[58] Field of Search ............... 324/158 P, 158 F, 72.5; 310/330; 73/105, 147, DIG. 4; 33/174 R, 174 PA

[56] References Cited

U.S. PATENT DOCUMENTS

| 2,558,563 | 6/1951 | Janssen | 73/DIG. 4 |
|---|---|---|---|
| 2,782,636 | 2/1957 | Peucker | 73/147 |
| 3,093,710 | 6/1963 | Eyck | 310/330 |
| 3,446,065 | 5/1969 | Wiesler et al. | 73/105 |
| 3,810,017 | 5/1974 | Wiesler et al. | 324/158 P |
| 3,849,728 | 11/1974 | Evans | 324/158 P |

OTHER PUBLICATIONS

Byrnes et al., "Self-Measurement of Probe Deflection . . .", IBM Tech. Dis. Bull., vol. 20, No. 1, Jun. 1977, pp. 166-167.

Primary Examiner—Ernest F. Karlsen
Attorney, Agent, or Firm—William E. Hiller; Melvin Sharp; James T. Comfort

[57] ABSTRACT

A four-quadrant multiprobe edge sensor system which comprises a printed circuit board having a plurality of data probes mounted thereon which include four data-detector probes particularly-positioned. The data-detector probes include a support body, and an arm supported by the body and attached thereto in an angular fashion. A probe tip in the form of a needle extends from and is attached to the arm. The probe tip includes a downwardly positioned point for contact with the surface having integrated circuits defined thereon. A force sensitive material is attached to but electrically isolated from the arm and has conductor leads extending therefrom with said force sensitive material comprising a piezoelectric material, for example. The four data-detector probes are located on the printed circuit board such that when being used for testing, the probe tips of the four data-detector probes are placed in each of the four corners of an integrated circuit chip defined on a semiconductor slice. The four-quadrant edge sensor detects the edge of the semiconductor slice regardless of the direction the slice is moving in relation to the probe head. This detection is signaled to a detection circuit which sends a signal to the multiprobe to begin indexing and reversing direction of the slice movement for testing the next chip.

14 Claims, 6 Drawing Figures

FOUR-QUADRANT, MULTIPROBE-EDGE SENSOR FOR SEMICONDUCTOR WAFER PROBING

BACKGROUND OF THE INVENTION

This invention relates to a probe device and more specifically to a probe device having four data probes equipped with sensors for sensing surface contact in the Z-axis and detecting the surface edge.

In the formation of electronic circuits, integrated circuits may be fabricated from thin semiconductor slices having a multiplicity of matrixes or microcircuits thereon. The general practice is for each slice to contain a multiple of identical repeating matrixes of the same type of microcircuits. The individual unit or circuit is sometimes referred to as an integrated circuit chip or an individual bar.

Before distribution the present practice is to test each of the circuits of each integrated circuit chip on a slice or wafer prior to separating the slice into the desired integrated circuit components or combinations thereof.

Since each microcircuit or integrated circuit of each wafer is normally positioned in a predetermined precise relation with respect to adjacent circuit units, it is possible to test the circuitry if a probe can be accurately located on each preselected point that corresponds to the circuit to be tested. It is possible, for example, to test several different circuits at the same time on any one integrated circuit.

In the test procedure therre are several obstacles to overcome in order to have reliable testing without damaging the slice. One of the difficulties experienced in the use of testing probes which include a supporting body having a needle connected thereto, is that the point of the probe tip may form a scratch on the surface of the semiconductor wafer as it is contacted by the point. This is caused by the lack of an effective Z-axis control. The Z-axis is the direction established by the vertical movement of the chuck with respect to the probe tips. Among other things, the Z-axis control is needed to compensate for surface warpage of slices which may be as much as 5 mils across the surface of a large slice, determining the point of contact with the wafer, and in determining when the probe tips are off the slice i.e. edge detection.

Semiconductor slice testing is performed on a multiprobe machine such as the multiprobe manufactured by Electroglas Corp., Menlo Park, California model 1034X. The multiprobe machine contains a probe card which is a printed circuit board having attached thereto a series of data probes for injecting signals and collecting test data from the semiconductor slice. The present practice includes an edge sensor on the probe card which is in the form of a data probe having an electrical switch mechanism. Operationally the conventional edge sensor functions such that when the probe tip makes contact with the silicon slice an electrical open is caused. This open is detected by the multiprobe system and allows for a continuance of the testing procedures. When the chuck or support block for the semiconductor slice is vertically moved to make contact with the probe tips and no contact is detected by the edge sensor the open condition will not occur and the multiprobe system will perform an indexing procedure and move the slice such that the data probes are over the next row of integrated circuit chips. This conventional edge sensor has been found to be unreliable in the art and the cause of a significant amount of down time of the multiprobe system and damage to chips which results when the chuck is continuously moved upward and probe tip contact is not identified. After the probe tips make contact with the slice it is necessary for the chuck to move an additional 1-5 mils of overtravel in order to break through the oxide layer and make good electrical contact with the active circuit elements, a technique called scrub-in. If the probe contact with the slice is not identified the overtravel cannot be controlled and the result is probe tip breakage, excessive overtravel, which damages chips, and machine down time.

In co-pending application "Method and Apparatus for Determining Probe Contact", Lee Reid, Ser. No. 873,564, filed Jan. 30, 1978 a device is disclosed for edge-sensing and Z-axis control. This device is in the form of a probe having a force sensitive material attached thereto such that when surface-contact is made with the probe tip the force distributed over the force sensitive material generates a signal that is detected by an external detector circuit and delivered to a multiprobe system. This device is used to sense the edge of a semiconductor slice having an integrated circuit thereon.

Although the sensor disclosed in the above-identified co-pending application is an improvement over the more mechanical edge sensing device the use of a single edge sensor has inherent problems. The nature of the semiconductor slice is such that the integrated circuits defined thereon are in a pattern series of chips which may be rectangular in geometry. Due to the circular nature of the semiconductor slice there results a series of partial integrated circuit chips on the edges of the semiconductor slice. The use of a single edge sensor will identify approximately half of the partial chips as a surface to be tested and the result is that the multiprobe system will try to test these partial bars, wasting time, identifying the partial bar to be a bad circuit, and thereby inking the partial bar for identification. This series of events results in a loss of time and machine throughput, ink, and possible inking of the support structure, which causes additional wasted time cleaning up.

A further problem is encountered in testing the broken semiconductor slice which gives rise to an increased number of partial chips making edge detection of even greater importance.

SUMMARY OF THE INVENTION

In accordance with the present invention it is proposed to replace the single edge sensing, Z-axis control device having a force sensitive material thereon for detecting surface contact, with a four-quadrant edge sensing assembly. The four-quadrant edge sensing assembly includes a printed circuit board having a plurality of data probes physically and electrically connected thereto and further having four data-detector probes that are comprised of a support body, and an arm connected to the support body and extending therefrom in an angular fashion. A probe tip is connected to the arm with an adjusting mechanism, such as a screw, for changing the plane of the probe tip. The data-detector probe performs as a data probe and an edge sensor when a force sensitive material such as lead zirconate-lead titanate (PZT), for example, is bonded to the arm and mechanically deformed when the probe tip makes contact with a surface such as a semiconductor slice. By locating the four data-detector probes on the printed circuit board such that when testing a semiconductor slice the four data-detector probes are found in each corner of an integrated circuit chip; partial integrated circuit chips may be detected as well as the edge of the slice. The signal generated by the force sensitive material is detected by a detector circuit which in turn delivers a signal to the multiprobe system which enables the identification of partial bars and indexing of the support for the semiconductor slice to test the next row of integrated circuit chips. Having four data-detector probes located one in each corner of the integrated circuit chip enables the sensing of an edge while moving in any direction. This is especially important when testing broken chips with irregular edges.

DETAILED DESCRIPTION OF THE DRAWINGS

Figure 1:
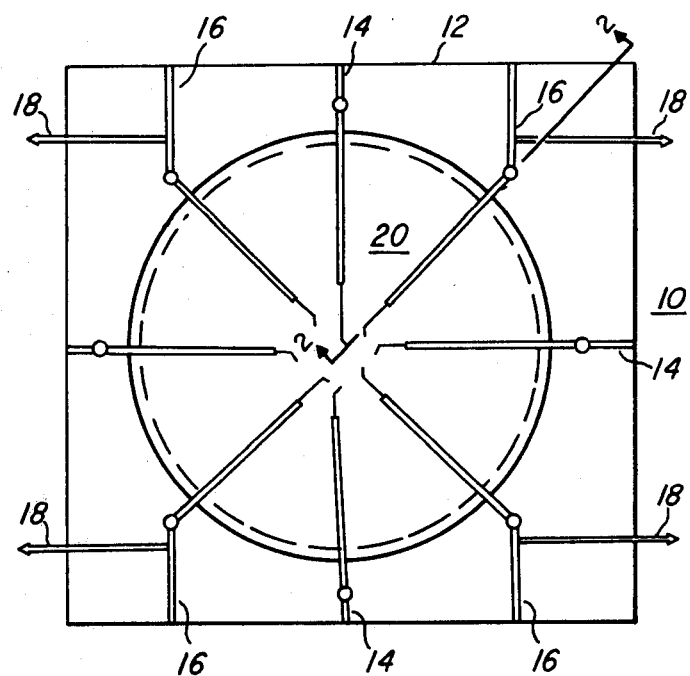
FIG. 1 is a top view of a probe card assembly having four data-detector probes attached thereto in accordance with the present invention.

Referring now to the drawings and more particularly to FIG. 1, a probe card assembly 10 is illustrated. The probe card assembly 10 is structured such that a printed circuit board 12 is used to support a plurality of data probes 14, and four data-detector probes 16. The data-detector probes 16 have a lead wire 18 attached thereto for sending a signal from the sensing device. The data-detector probes 16 and data probes 14 are shown in FIG. 1 as being located in spaced parallel relation to a semiconductor slice 20.

Figure 2:
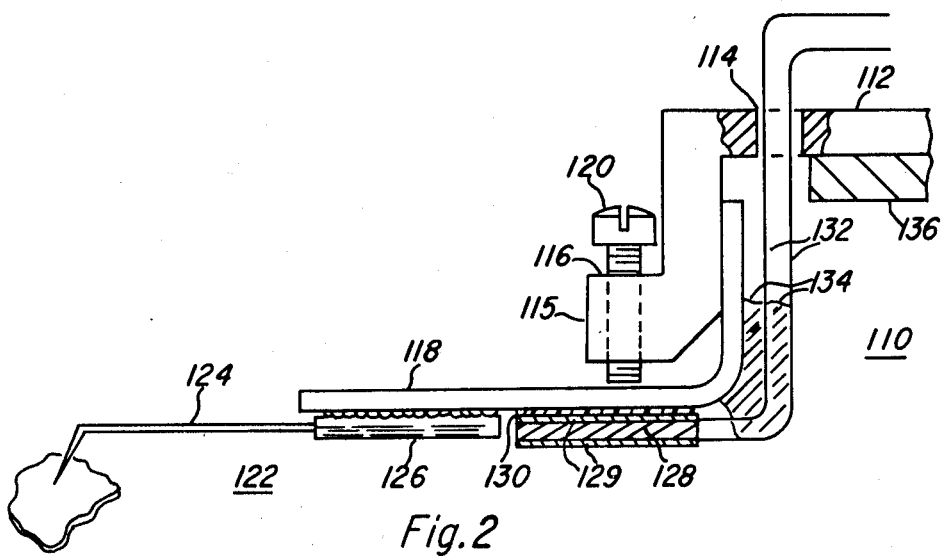
FIG. 2 is a partially diagrammatic, cross-sectional view taken along the line 2—2 of FIG. 1 and showing a data-detector probe as part of the probe card assembly in accordance with the present invention.

The data-detector probe 16 is further illustrated in FIG. 2. Structurally, the data-detector probe device 110 comprises a support body 112 having first and second apertures 114 and 116, respectively. The support body 112 may be an L-shaped structure where the first aperture/14 is located on the long side of the L and the second aperture/16 located in the flange 115 of the short side of the L-shaped structure 112. The support body 112 may be of a conductive material as brass, for example, and further may be gold plated.

An arm 118 is attached to the support body 112 and is extended therefrom. The extended arm 118 may also have an L-shaped structure such that the short section of the L-shaped arm is attached to the short section of the L-shaped support structure 112. The extended arm may also be of a conductive material such as brass and also may be gold plated.

An adjusting screw 120 located within said second aperture 116 found in the support structure 112 extends through to the extended arm 118.

A test needle assembly 122 having a needle 124 and a needle support sleeve 126 is attached to the extended arm 118. The needle 124 is utilized to contact the semiconductor slice having integrated circuits thereon such that relevant electrical data signifying the usefulness of a particular integrated circuit chip may be obtained. This is the main function of the needle 24 when utilized as a data gathering probe.

In order to sense Z-axis contact, that is that point in time when the test needle 124 has made contact with a semi-conductor surface, a force sensitive material 128 may be attached to the extended arm 118 of the test probe detector device 110. The force sensitive material is bordered by silver plated regions 129. In order to insulate the force sensitive material 128 from the conductive properties of the remainder of the probe device 110 the silver plates 129 of the force sensitive material 128 may be attached to the extended arm 118 by insulating epoxy material 130. The force sensitive material 128 may comprise a piezoelectric substrate or a monomorph or a piezoelectric sandwich type structure called a bimorph. The characteristics of the piezoelectric material are such that it may perform as a generator. This characteristic is such that when the piezoelectric material is deformed or flexed a voltage signal is generated by the material itself. A pair of lead wires or conductors 132 are soldered to the silver plates 129 of the force sensitive material 128. Thus, if a piezoelectric material were used as a force sensitive material 128, upon deforming a voltage will be generated and sensed across lead wires 132. Lead wires 132 are insulated from each other. Each lead wire is covered with a conforming insulation and extended up through the first aperture 114 found in the support body 112 of the probe detector test structure 110. The signal is then delivered to a detector circuit illustrated in FIG. 3 described hereinafter. The lead wires 132 may be bonded to the arm 118 by an epoxy 134.

By utilizing a data-detector probe device 110 as illustrated in FIG. 2 in the probe card assembly 10 of FIG. 1 it is possible to place the four data-detector probes 16 shown in FIG. 1 on the semiconductor slice 20 such that there is one data-detector probe 16, in each of the four quadrants of the integrated circuit chip being tested on the semiconductor slice 20. This four-quadrant approach enables edge detection and the detection of a partial integrated circuit on the edge of a slice and also a partial integrated circuit on a broken or fractured semiconductor slice. This means of detection can be used regardless of the direction the four data-detector probes 16 are moving in relation to the semiconductor slice 20. A more detailed explanation of the operation of the four-quadrant approach may be found hereinafter in the description of the multiprobe system shown in FIG. 3.

Figure 3:
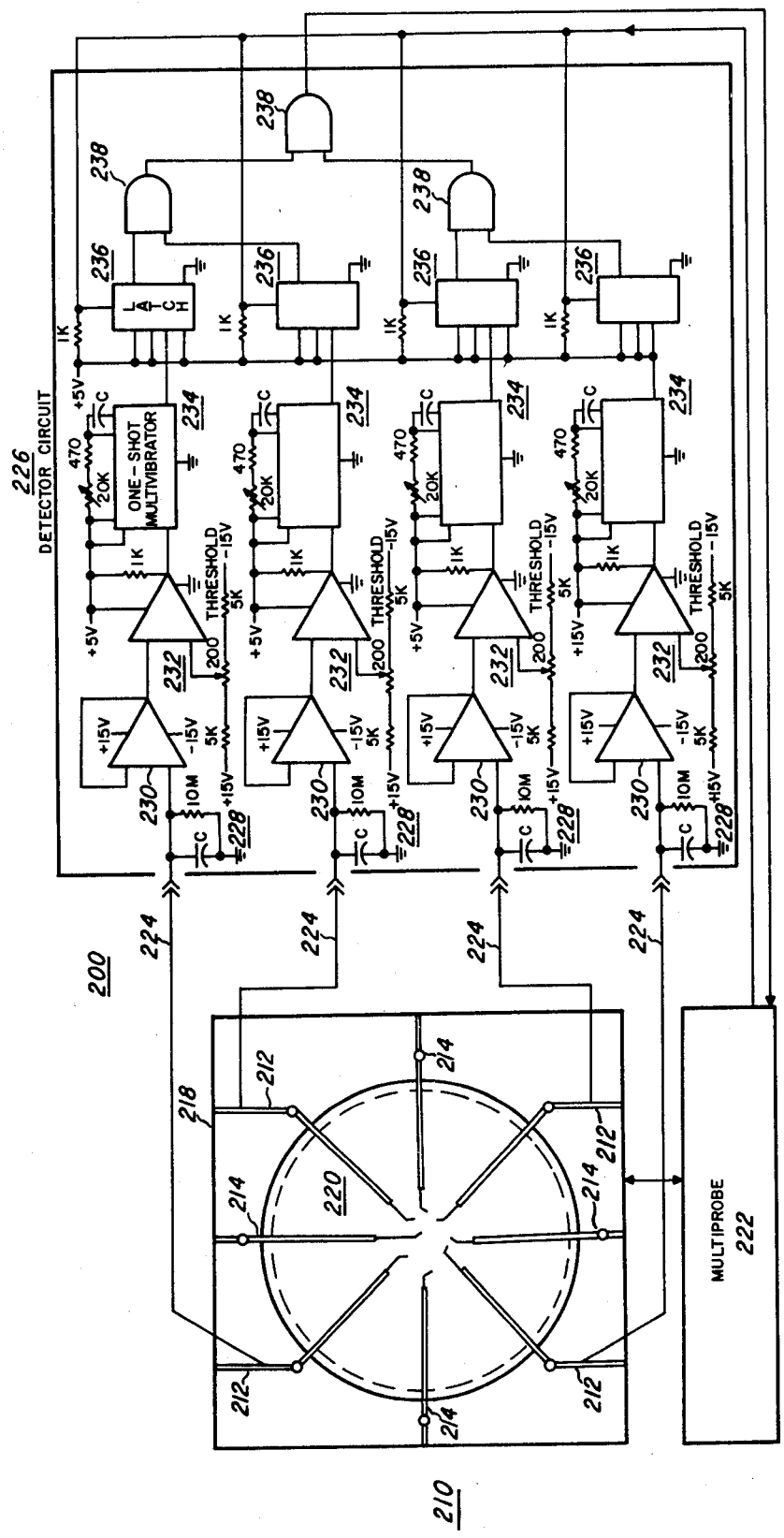
FIG. 3 is a partial block diagram and partial circuit schematic illustrating a multiprobe test system having a probe card with four data-detector probes attached to a detector circuit and further interfacing with a multiprobe.

Referring now to FIG. 3, a multiprobe test system 200 is illustrated. A multiprobe test system 200 is structurally comprised of a probe card assembly unit 210 similar to the probe card assembly unit illustrated in FIG. 1 and described above. The probe card assembly unit 210 is positioned over a semiconductor slice 220. The probe card assembly 210 has four data-detector probes 212 and a plurality of data probes 214 attached thereto. The data probes 214 and data-detector probes 212 are electrically connected to the probe card 218 such that data obtained from the semiconductor slice 220 may be electrically transferred to a multiprobe 222. The multiprobe device 222 may be of the type manufactured by Electroglas Corp., Menlo Park, California, model 1034X.

Each of the data-detector probes 212 delivers a voltage signal over their respective conductors 224. Conductors 224 interface with a detector circuit 226. The detector circuit 226 is a four channel detector circuit utilizing one channel for each of the conductors 224. Each channel comprises an RC filter assembly 228 electrically connected to a unity gain buffer amplifier 230 where the RC filter 228 filters out any noise and dampens the response time of the voltage signal received from the data-detector probes 212 and the unity gain buffer amplifier transforms the signal from a high impedance signal to a low impedance signal. This low impedance signal is then connected to a level discriminator assembly 232. The level discriminator assembly 232 is of the threshold level type whereby unless the signal reaches a predetermined threshold voltage, for example, 30 millivolts, the signal will not be recognized and essentially blocked. IF, however, the signal is above the threshold limit the signal will be set to the maximum voltage at that point, as, for example, the five volts found in the FIG. 3 circuit. After screening spurious signals the desired signal at a nominal five volt voltage level is delivered to a one shot multivibrator unit 234. This one shot multivibrator unit 234 provides a signal delay, for example, 0.5 ms, required before the multiprobe can accept data. The signal is then delivered to a latch circuit 236 which latches the signal to, for example, a zero voltage and delivers that signal along with the signal from the other channels to a series of positive "and" gates 238. If all the data-detector probes contact a surface, an output interrupt signal will be delivered to the multiprobe unit 222. If, however, any one of the inputs to the "and" gates fail to go "high", that will indicate one or more of the data-detector probes 212 has not made contact with the semiconductor slice 220 and an edge has been detected. This edge detection will generate an interrupt signal which causes the multiprobe 222 to index and begin testing a new row of integrated circuit chips. After the signal is delivered to the multiprobe 222 whether it is an interrupt signal or a signal indicating that all data probe sensors 212 have made contact with the slice 220, the multiprobe 222 will send a reset signal back to the latch circuit 236 to reset the latch to its predetermined state in preparation for the next chip to be probed.

Thus, operationally, the detector circuit 226 enables the multiprobe unit 222 to recognize when any one or more of the four data-detector probes 212 does not contact the surface of the semiconductor slice 220. This information allows for indexing the probes 212 and 214 to a new row of integrated circuit chips without testing a partial bar since all four data-detector probes 212 must make contact before a test will occur. Therefore, the data-detector probe assembly not only detects the edge of a semiconductor slice but also recognizes when a partial integrated circuit chip is about to be tested and prevents the test thus saving time and ink on the partial chip, and increasing machine throughput.

Figure 4:
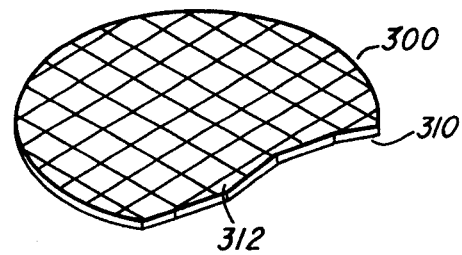
FIG. 4 is a perspective view of a semiconductor slice in a fractured state.
Figure 5:
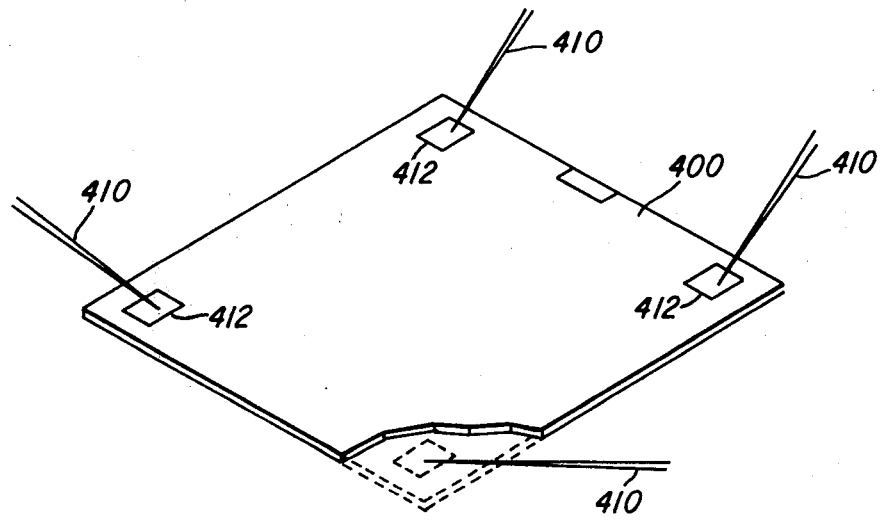
FIG. 5 is an expanded view of an integrated circuit chip along the fracture of the semiconductor slice illustrated in FIG. 4.

FIG. 4 illustrates a semiconductor slice 300 that has been fractured thus giving rise to an abnormal jagged edge 310. It is recognized that in such an instance the abnormal jagged edge 310 will enhance the possibility of partial integrated circuit chips 312 along that edge. In FIG. 5 one such partial integrated circuit chip 400 may be seen as having part of its lower right quadrant cut off and therefore this chip has no utility. Use of a conventional edge detector or merely a single edge detector would not indicate that this was a partial chip if the detector were to fall on any of the available partial chip area. However, utilizing a data-detector probe 410 similar to the data-detector probe 110 described and illustrated in FIG. 2 on each of the bonding pads 412 nearest the four corners of an integrated circuit chip, it can be seen that one of the data-detector probes 410 will be off the surface and in a multiprobe system 200 as is illustrated in FIG. 3 and described above, a signal will be sent to the multiprobe indicating that a partial chip or an edge has been detected and an indexing procedure will take place.

Figure 6:
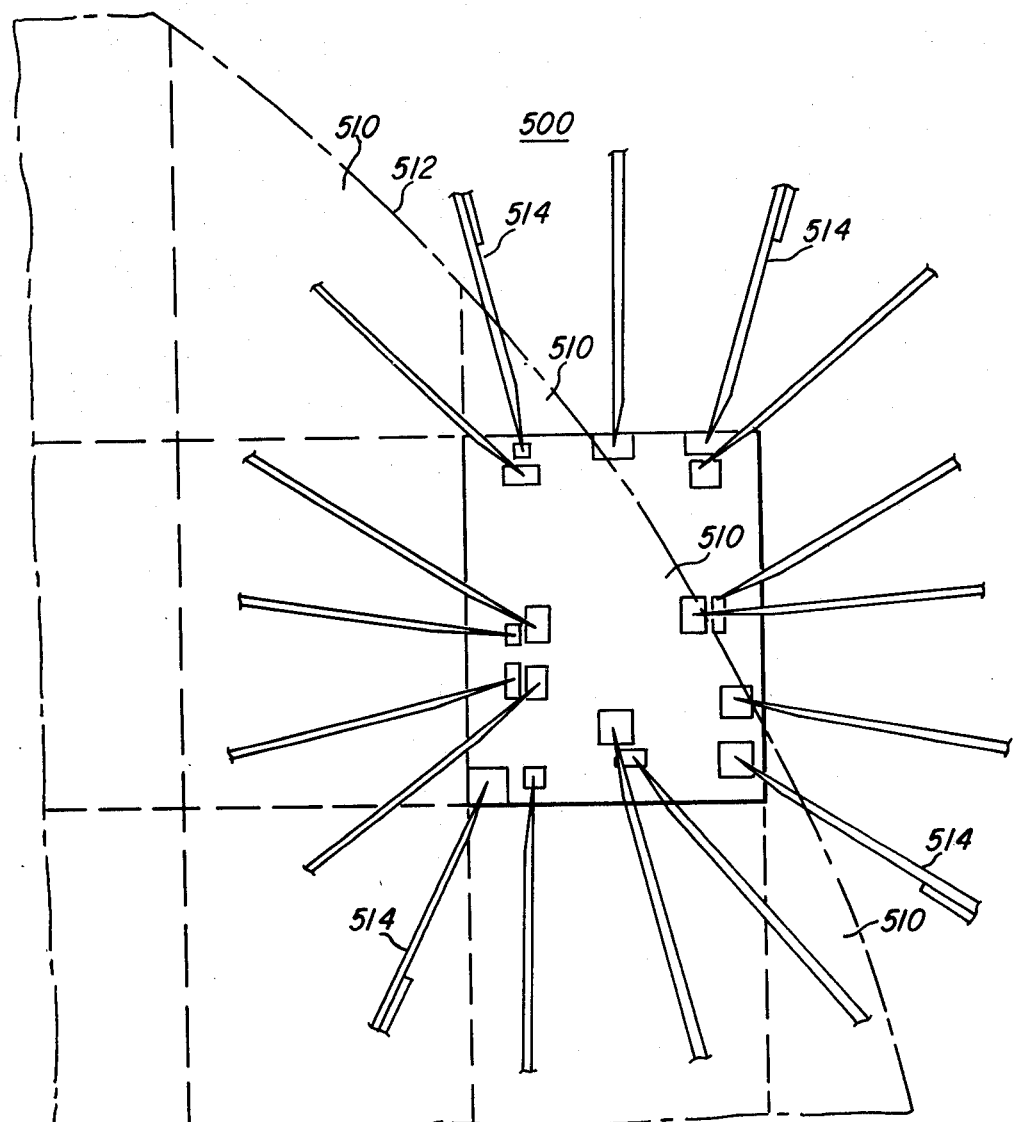
FIG. 6 is an enlarged view of a normal semiconductor slice having a series of partial integrated circuit chips along its edge.

FIG. 6 demonstrates that the four-quadrant approach may also be useful on a standard semiconductor slice 500 not having the jagged edge as demonstrated in FIG. 4. The semiconductor slice 500 of FIG. 6 also reveals a series of partial integrated circuit chips 510 along its smooth edge 512. Once again by placing a data-detector probe 514 on bonding pads nearest each of the corners of an integrated circuit chip being tested on the semiconductor slice 500, if a partial chip is on the edge 512, one of the data-detector probe 514 will be off the surface, and by way of a detector circuit, similar to the detector circuit found in FIG. 3 described above, the multiprobe unit will recognize the partial chip or edge and thus index and begin testing a new row of integrated circuit chips, if this is the desired action.

While the present invention has been described and illustrated with respect to specific embodiments, it will be understood that various modifications may be made without departing from the spirit and scope of the present invention.

What is claimed is:

1. A four-quadrant edge detector assembly comprising:
    electrical support means for locating a plurality of data probes for testing microcircuits disposed on a semiconductor surface; and
    means for detecting said surface with each of said means having,
        a support body,
        an arm connected to said support body and extending therefrom in an angular fashion,
        a probe tip having an angular point connected to said arm and extending therefrom,
        adjustable means attached to said support body and operatively associated with said arm for altering the plane in which said probe tip lies, and
        sensing means comprising a force sensitive material secured to said arm for sensing when said probe tip makes contact with said surface and generating an electrical signal indicative thereof, and further with each of said means for detecting said surface located on said electrical support means such that there is at least one of said means for detecting in each of the four quadrants of said microcircuit so as to allow detection of a partially present portion of said microcircuit.

2. A four-quadrant edge detector assembly as set forth in claim 1 wherein said support body comprises a conductive material.

3. A four-quadrant edge detector assembly as set forth in claim 1 wherein said force sensitive material comprises a piezoelectric material.

4. A four-quadrant edge detector assembly as set forth in claim 1 wherein said adjustable means comprises an adjustable screw.

5. A four-quadrant edge detector assembly as set forth in claim 1 wherein said electrical support means comprises a printed circuit board.

6. A multiprobe test system for testing microcircuits comprising:
moveable support means for locating a semiconductor slice having a plurality of integrated circuits thereon;
electrical support means located in parallel spaced relation to said moveable support means;
a plurality of data probes electrically connected to said electrical support means for testing said integrated circuits;
means for detecting the surface of said semiconductor slice, attached to said electrical support means and located between said data probes with each of said means for detecting including
a support body,
an arm connected to said support body and extending therefrom in an angular fashion,
a probe tip having an angular point connected to said arm and extending therefrom,
adjustable means attached to said support body and operatively associated with said arm for altering the plane in which said probe tip lies, and
sensing means comprising a force sensitive material secured to said arm for sensing when said probe tip makes contact with said semiconductor slice having a plurality of integrated circuit chips defined thereon, said means generating an electrical signal indicative of said contact, wherein said means for detecting is located such that there is at least one in each of the four quadrants of any of said integrated circuit chips so as to allow detection of a partially present portion of said any of said integrated circuit chips,
detector circuit means electrically associated with said means for detecting said semiconductor slice for delivering an electrical signal signifying that said means for detecting and said data probes have made contact with said semiconductor slice; and
means for evaluating signals received from said data probes and said detector circuit means.

7. A multiprobe test system for testing microcircuits comprising:
movable support means for locating a semiconductor slice having a plurality of integrated circuits thereon;
electrical support means located in parallel spaced relation to said movable support means;
a plurality of data probes electrically connected to said electrical support means for testing said integrated circuits;
means for detecting the surface of said semiconductor slice, attached to said electrical support means and located between said data probes with each of said means for detecting including
a support body,
an arm connected to said support body and extending therefrom in an angular fashiobn,
a probe tip having an angular point connected to said arm and extending therefrom,
adjustable means attached to said support body and operatively associated with said arm for altering the plane in which said probe tip lies, and
sensing means comprising a force sensitive material bonded to said arm for sensing when said probe tip makes contact with said semiconductor slice having a plurality of integrated circuit chips defined thereon wherein said means for detecting is located such that there is at least one in each of the four quadrants of any of said integrated circuit chips;
detector circuit means electrically associated with said means for detecting said semiconductor slice for delivering an electrical signal signifying that said means for detecting and said data probes have made contact with said semiconductor slice, said detector circuit means comprising a four channel circuit wherein each channel includes:
filter means for screening noise from said signal delivered from said force sensitive material,
amplifier circuitry electrically connected to said filter means for transforming the impedance of said signal,
electronic discriminator means for screening spurious signals such that only signals above a fixed threshold voltage will be detected, said level discriminator being electrically connected to said amplifier circuitry.
a one-shot multivibrator circuit for holding said signal voltage at a predetermined level for a predetermined time, and
a latch circuit for latching said signal and delivering an output signal to a multiprobe device; and
means for evaluating signals received from said data probes and said detector circuit means.

8. A multiprobe system as set forth in claim 7 further including a plurality of 'and' gates for receiving the output signals from each of said four channel latch circuits such that an absence of any one signal will cause an interrupt signal to be delivered to said multiprobe device.

9. A multiprobe test system as set forth in claim 8 wherein said amplifier circuitry comprises a unity gain buffer amplifier.

10. A four-quadrant multiprobe sensor system for testing micro-electronic units on a semiconductor slice, said sensor system comprising:
probe-supporting means;
data-detector probe means mounted on said probe-supporting means and including at least four probe tips arranged in each of four respective quadrants of a spatial area adapted to coincide with a micro-electronic unit on a semiconductor slice undergoing testing for prospective contact of the probe tips with the four corners of the micro-electronic unit; and
means operably associated with each of said four probe tips of said data-detector probe means responsive to the contact of the respective probe tip with a corner portion of a micro-electronic unit on the semiconductor slice to generate an electrical signal indicative of said contact.

11. A four-quadrant multiprobe sensor system for testing micro-electronic units on a semiconductor slice, said sensor system comprising:
probe-supporting means;
a plurality of data probes mounted on said probe-supporting means and having respective probe tips, said plurality of data probes including at least four data-detector probes having probe tips arranged in each of four respective quadrants of a spatial area adapted to coincide with a micro-electronic unit on a semiconductor slice undergoing testing for prospective contact of the probe tips with the four corners of the micro-electronic unit; and means on each of said four data-detector probes responsive to the contact of the probe tip of the respective data-detector probe with a corner portion of a micro-electronic unit on the semiconductor slice to generate an electrical signal indicative of said contact.

12. A multiprobe sensor system as set forth in claim 11, wherein said electrical signal-generating means on each of said four data-detector probes comprises a force sensitive material deflectable in response to a contact of the probe tip with a surface of the semiconductor slice having a micro-electronic unit thereon so as to generate an electrical signal indicative of said contact.

13. A multiprobe sensor system as set forth in claim 12, wherein the force sensitive material of said electrical signal-generating means on each of said four data-detector probes comprises a piezoelectric material.

14. A multiprobe sensor system as set forth in claim 11, wherein said probe-supporting means comprises a printed circuit board having a centrally disposed aperture provided therethrough;

said plurality of data probes being mounted on said printed circuit board in spaced relation with respect to each other and extending radially inwardly to overlie the aperture therein; and the probe tips of each of said plurality of data probes including said at least four data-detector probes being disposed within the aperture of said printed circuit board for contact with micro-electronic units on the semiconductor slice undergoing testing which is adapted to be exposed to said probe tips through the aperture in said printed circuit board.

* * * * *